(12) United States Patent
Lee et al.

(10) Patent No.: US 10,720,382 B2
(45) Date of Patent: Jul. 21, 2020

(54) SEMICONDUCTOR PACKAGE STRUCTURE AND SEMICONDUCTOR MODULE INCLUDING THE SAME

(71) Applicant: SAMSUNG ELECTRONICS CO., LTD., Suwon-si, Gyeonggi-do (KR)

(72) Inventors: YoungJoon Lee, Hwaseong-si (KR); Sunwon Kang, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/029,770

(22) Filed: Jul. 9, 2018

(65) Prior Publication Data
US 2019/0164870 A1    May 30, 2019

(30) Foreign Application Priority Data
Nov. 29, 2017    (KR) .................. 10-2017-0161953

(51) Int. Cl.
*H01L 23/495* (2006.01)
*H01L 23/498* (2006.01)
*H01L 25/065* (2006.01)
*H01L 23/00* (2006.01)
(Continued)

(52) U.S. Cl.
CPC .. *H01L 23/49541* (2013.01); *H01L 23/49811* (2013.01); *H01L 23/49816* (2013.01); *H01L 23/49822* (2013.01); *H01L 24/48* (2013.01); *H01L 25/0657* (2013.01); *H01L 25/105* (2013.01); *H01L 23/145* (2013.01); *H01L 23/15* (2013.01); *H01L 23/3121* (2013.01); *H01L 23/3128* (2013.01); *H01L 23/481* (2013.01); *H01L 24/16* (2013.01); *H01L 24/31* (2013.01); *H01L 24/45* (2013.01); *H01L 24/73* (2013.01);
(Continued)

(58) Field of Classification Search
CPC ........... H01L 23/49541; H01L 23/3128; H01L 23/49816; H01L 23/49822; H01L 24/48; H01L 25/0657; H01L 2224/48227; H01L 2225/0651; H01L 2225/06541
See application file for complete search history.

(56) References Cited

U.S. PATENT DOCUMENTS 5,648,682 A  *  7/1997  Nakazawa  .......... H01L 23/3107
                                                257/673
5,770,300 A      6/1998  Okamoto et al.
(Continued)

FOREIGN PATENT DOCUMENTS

JP          6029188 B2     11/2016
JP        2017-028131 A    2/2017
(Continued)

*Primary Examiner* — Peter Bradford
(74) *Attorney, Agent, or Firm* — Lee IP Law, P.C.

(57) ABSTRACT

Disclosed are semiconductor package structure and semiconductor modules including the same. The semiconductor module includes a circuit board, a first semiconductor package over the circuit board, and a connection structure on the circuit board and connecting the circuit board and the first semiconductor package. The first semiconductor package includes a first package substrate. A difference in coefficient of thermal expansion between the connection structure and the circuit board may be less than a difference in coefficient of thermal expansion between the circuit board and the first package substrate.

11 Claims, 8 Drawing Sheets

(51) Int. Cl.
  *H01L 25/10*   (2006.01)
  *H01L 23/31*   (2006.01)
  *H01L 23/15*   (2006.01)
  *H01L 23/48*   (2006.01)
  *H01L 23/14*   (2006.01)

(52) U.S. Cl.
  CPC ............ *H01L 2224/13025* (2013.01); *H01L 2224/16225* (2013.01); *H01L 2224/32145* (2013.01); *H01L 2224/32225* (2013.01); *H01L 2224/45144* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2225/0651* (2013.01); *H01L 2225/06541* (2013.01); *H01L 2924/00014* (2013.01); *H01L 2924/1431* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 6,175,158 | B1 | 1/2001 | Degani et al. |
| 6,184,580 | B1 | 2/2001 | Lin |
| 6,655,022 | B1 | 12/2003 | Eskildsen et al. |
| 6,872,465 | B2 | 3/2005 | Soga et al. |
| 6,977,431 | B1 | 12/2005 | Oh et al. |
| 7,034,387 | B2 | 4/2006 | Karnezos |
| 7,417,308 | B2 | 8/2008 | Park |
| 7,939,372 | B1 * | 5/2011 | Chang ................ H01L 23/3107 438/108 |
| 8,470,644 | B2 | 6/2013 | Yu et al. |
| 9,476,898 | B2 | 10/2016 | Takano |
| 2003/0030143 | A1 * | 2/2003 | Wennemuth ........ H01L 23/3114 257/738 |
| 2005/0282315 | A1 | 12/2005 | Jeong et al. |
| 2009/0267217 | A1 | 10/2009 | Kuwabara |
| 2010/0326714 | A1 * | 12/2010 | Fukuzono ........... H01L 21/4857 174/259 |
| 2012/0044415 | A1 * | 2/2012 | Tsuduki ............ H01L 27/14618 348/374 |
| 2016/0150649 | A1 * | 5/2016 | Peng ................ H01L 23/49822 361/761 |

FOREIGN PATENT DOCUMENTS

| | | |
|---|---|---|
| KR | 10-0324331 B1 | 1/2002 |
| KR | 10-0630684 B1 | 9/2006 |
| KR | 10-0637008 B1 | 10/2006 |

\* cited by examiner

SEMICONDUCTOR PACKAGE STRUCTURE AND SEMICONDUCTOR MODULE INCLUDING THE SAME

CROSS-REFERENCE TO RELATED APPLICATION

Korean Patent Application No. 10-2017-0161953, filed on Nov. 29, 2017, in the Korean Intellectual Property Office, and entitled: "Semiconductor Package Structure and Semiconductor Module Including the Same," is incorporated by reference herein in its entirety.

BACKGROUND

1. Field

Embodiments relate to a semiconductor package structure and a semiconductor module including the same.

2. Description of the Related Art

In the semiconductor industry, integrated circuit packaging technology has been developed to satisfy requirements for small-form-factor devices and high package reliability. For instance, package techniques capable of achieving a chip-size package are actively being developed to satisfy the requirements for small-form-factor devices, and package techniques capable of promoting efficiency in a package process and improving mechanical and electrical reliability of a packaged product have attracted considerable attention in terms of high package reliability.

SUMMARY

According to exemplary embodiments, a semiconductor module may include a circuit board, a first semiconductor package over the circuit board, and a connection structure on the circuit board and connecting the circuit board and the first semiconductor package. The first semiconductor package may include a first package substrate. A difference between thermal expansion coefficients of the connection structure and the circuit board may be less than a difference between thermal expansion coefficients of the circuit board and the first package substrate.

According to exemplary embodiments, a semiconductor package structure may include a connection structure having a plurality of outer leads and a plurality of inner leads between the outer leads, and a semiconductor package on the connection structure and including a package substrate, a plurality of solder balls on one side of the package substrate, and a semiconductor chip on an opposite side of the package substrate. The inner leads may be in contact with the solder balls.

According to exemplary embodiments, a semiconductor module may include: a circuit board; and a semiconductor package structure on the circuit board. The semiconductor package structure may include a connection structure having a plurality of outer leads and a plurality of inner leads between the outer leads, and a semiconductor package on the connection structure and including a package substrate, a plurality of solder balls on one side of the package substrate, and a semiconductor chip on an opposite side of the package substrate. The inner leads may be in contact with the solder balls. The outer leads may be in contact with the circuit board.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
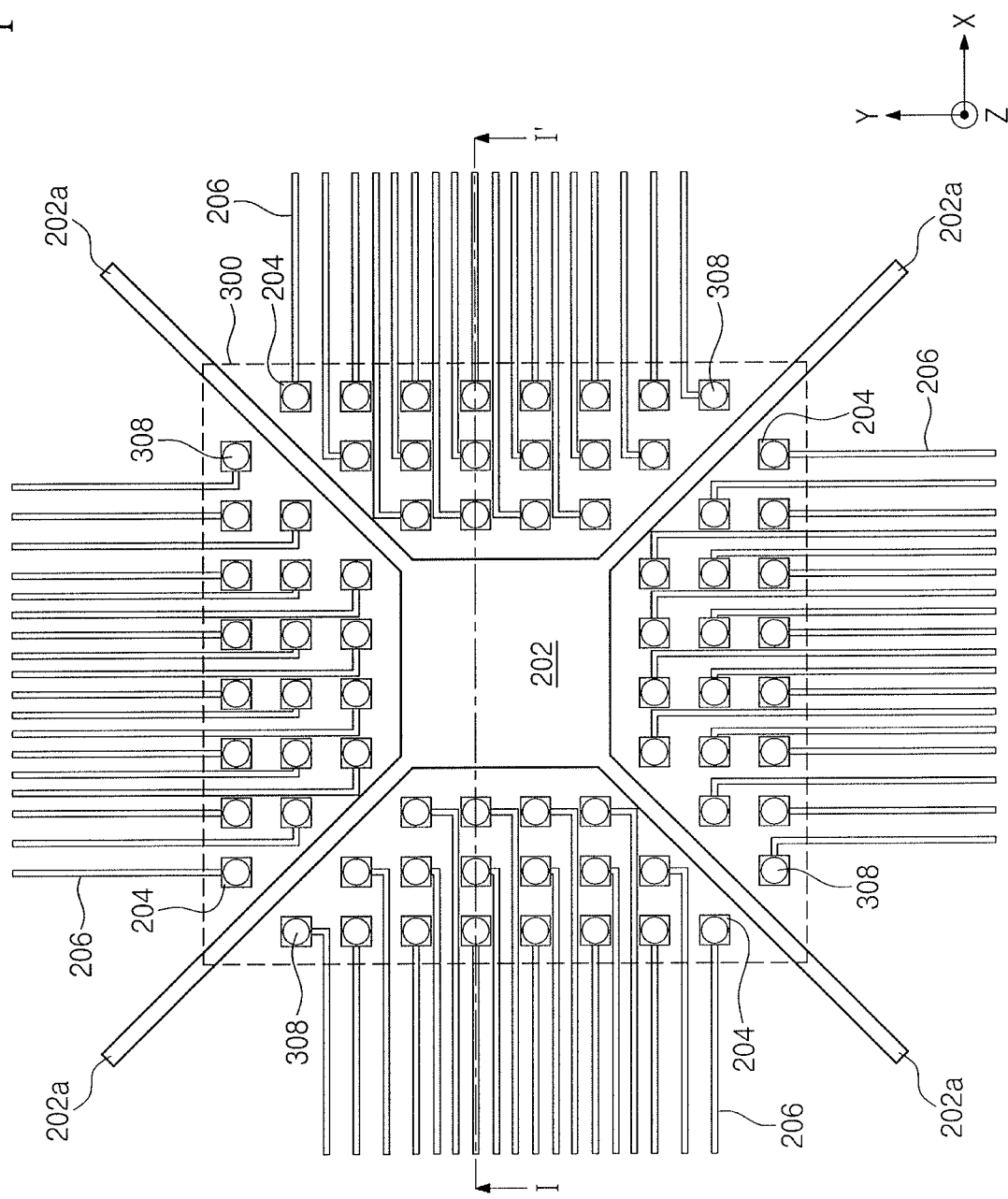
FIG. 1 illustrates a plan view of a semiconductor module according to exemplary embodiments.
Figure 2:
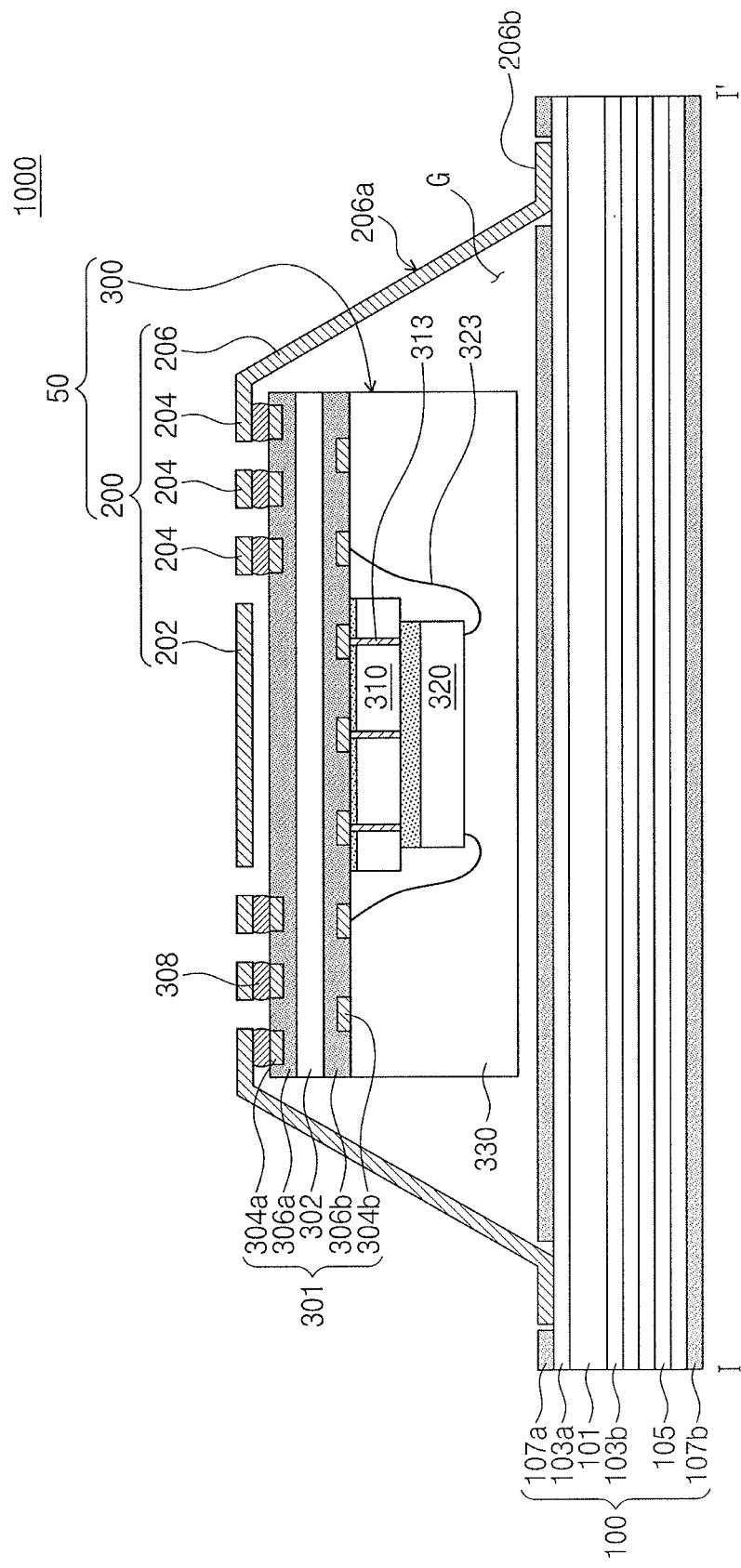
FIG. 2 illustrates a cross-sectional view taken along line I-I' of FIG. 1, of a semiconductor module according to exemplary embodiments.

FIG. 1 illustrates a top plan view along an X-Y plane of a semiconductor module according to exemplary embodiments. FIG. 2 illustrates a cross-sectional view along a Y-Z plane taken along line I-I' of FIG. 1 of a semiconductor module according to exemplary embodiments. X, Y, and Z directions may be first, second, and third directions, and may intersect, e.g., may be orthogonal to one another.

Referring to FIGS. 1 and 2, a semiconductor module 1000 may include a semiconductor package structure 50 and a circuit board 100. The circuit board 100 may include a first core 101, a first circuit line 103a, second circuit lines 103b, insulation layers 105, and first and second solder resist layers 107a and 107b.

The first core 101 may be or include glass fiber or resin. The glass fiber may be obtained by twisting several hundreds of glass filaments, one of reinforcing materials, to manufacture yarns and then weaving the yarns. The glass filament may be a processed ore product mainly composed of silica. The glass fiber may have excellent thermal resistance, mechanical strength, and electrical insulation.

The first circuit line 103a and the second circuit lines 103b may be on the first core 101. The first circuit line 103a may be on a first side of the first core 101. The second circuit lines 103b may be on a second side, opposite the first side along the Z direction, of the first core 101. For example, the first side of the first core 101 may be a top surface of the first core 101, and the second side of the first core 101 may be a bottom surface of the first core 101. The second circuit line 103b, the first core 101, and the first circuit line 103a may be sequentially stacked along the Z direction in that order. The number of the first and second circuit lines 103a and 103b may not be limited to that shown. The first and second circuit lines 103a and 103b may be electrically connected to each other through vias. The first and second circuit lines 103a and 103b may include at least one metal, e.g., copper (Cu), aluminum (Al), nickel (Ni), iron (Fe), tungsten (W), silver (Ag), gold (Au), or an alloy thereof.

The insulation layers 105 may be disposed between the second circuit lines 103b and the second solder resist layer 107b. The insulation layers 105 may include an oxide layer or a nitride layer.

The first solder resist layer 107a may be on, e.g., directly on, an uppermost one of the first circuit lines 103a and the second solder resist layer 107b may be adjacent a lowermost one of the second circuit lines 103b, e.g., with the insulation layers therebetween. For example, the first solder resist layer 107a may form the top of the circuit board 100 and the second solder resist layer 107b may form the bottom of the circuit board 100. The first solder resist layer 107a may include openings therein to expose a portion of the first circuit line 103a and the second solder resist layer 107b and the insulation layers 105 may include openings therein to expose a portion of the lowermost second circuit line 103b.

In some embodiments, the circuit board 100 may have a coefficient of thermal expansion (CTE, or thermal expansion coefficient) that changes depending on a material of the first core 101, a material of each of the first and second circuit lines 103a and 103b, the number of the first and second circuit lines 103a and 103b, and/or a constitutional ratio of materials included in the first and second circuit lines 103a and 103b. The CTE of the circuit board 100 may fall within a range, e.g., from about 0 ppm/fr to about 30 ppm/to. More narrowly, the CTE of the circuit board 100 may fall within a range from about 15 ppm/M to about 20 ppm/to.

The semiconductor package structure 50 may be on the circuit board 100. The semiconductor package structure 50 may include a connection structure 200 and a first semiconductor package 300. The connection structure 200 may be on the circuit board 100. The connection structure 200 may be a single layer. The connection structure 200 may include a central pad 202 and leads 204 and 206. The central pad 202 may have a rectangular shape in a plan view. Bars 202a may be disposed at corners of the central pad 202, e.g., may extend along the X-Y plane, e.g., along a diagonal, away from the central pad. The bars 202a may be on the circuit board 100, e.g., in contact therewith. The bars 202a of the central pad 202 may be physically/electrically separated from the leads 204 and 206. Alternatively, the connection structure 200 may include no central pad 202.

The leads 204 and 206 may surround the central pad 202. The leads 204 and 206 may include inner leads 204 and outer leads 206. The inner leads 204 may be disposed along a circumference of the central pad 202 and arranged in the X direction and the direction Y. The outer leads 206 may be physically and electrically connected to corresponding inner leads 204. The inner leads 204 may be between the outer leads 206 facing each other. Ones of the outer leads 206 connected to the inner leads 204 facing each other in the X direction may extend along the X direction, while other ones of the outer leads 206 connected to the inner leads 204 facing each other in the Y direction may extend along the Y direction. The outer leads 206 may be spaced apart from each other at a regular interval. The outer leads 206 may surround the inner leads 204.

The outer leads 206 may be bent from the inner leads 204. For example, the outer leads 206 may be bent toward the circuit board 100, e.g., along the Z direction. The connection structure 200 may have a protruding shape at its portion on which the inner leads 204 and the central pad 202 are disposed, e.g., the inner leads 204 and the central pad 202 may be at a same height along the Z direction from the circuit board 100. The connection structure 200 may have a recession G defined by, e.g., surrounded by, the outer leads 206. In particular, the outer leads 206 may have inclined surfaces 206a that extend from a corresponding inner lead 204 along the Z direction towards the circuit board 100 and along the X direction or the Y direction.

The outer leads 206 may include a flat surface 206b in contact with the circuit board 100. For example, the flat surfaces 206b may be in contact, e.g., in direct contact, with the first circuit line 103a through an opening in the first solder resist layer 107a. The flat surface 206b may be parallel to the inner leads 204, may not overlap the inner leads 204 along the Z direction, and may extend further away along the X or Y directions from the central pad 202 than the inclined surfaces 206a. A solder material may be interposed between the outer leads 206 and the first circuit line 103a. The connection structure 200 may be electrically connected to the circuit board 100.

The connection structure 200 may include a material whose CTE is the same as or similar to that of the circuit board 100. For example, the connection structure 200 may include the same material as those of the first and second circuit lines 103a and 103b. For another example, the connection structure 200 may include a material whose CTE is the same as or similar to those of the first and second circuit lines 103a and 103b. For another example, the connection structure 200 may include a material whose CTE is the same as or similar to that of the first core 101. The CTE of the connection structure 200 may fall within a range, for example, from about 0 ppm/he to about 30 ppm/to. More narrowly, the CTE of the connection structure 200 may be about 17 ppm/M. The connection structure 200 may include at least one metal of, for example, copper (Cu), nickel (Ni), iron (Fe), aluminum (Al), tungsten (W), silver (Ag), gold (Au), or an alloy thereof.

The first semiconductor package 300 may be provided on the circuit board 100. For example, the first semiconductor package 300 may be between the circuit board 100 and the connection structure 200, while not being in direct contact with the circuit board 100. In particular, the connection structure 200 may extend further along the Z direction, e.g., may be longer in a stacking direction, than the first semiconductor package 300. The first semiconductor package 300 may be in the recession G of the connection structure 200. For example, the first semiconductor package 300 may be spaced apart, e.g., completely spaced apart, from the circuit board 100 such that no portion thereof is in direct contact with the circuit board 100, e.g., an empty space may be between a bottom of the first semiconductor package 300 and the circuit board 100. The first semiconductor package 300 may include a first package substrate 301, a first semiconductor chip 310, a second semiconductor chip 320, through vias 313, first bonding wires 323, and a first molding layer 330.

The first package substrate 301 may include a second core 302, first and second metal lines 304a and 304b, and third and fourth solder resist layers 306a and 306b. The second core 302 may be or include glass fiber or resin. The glass fiber may be obtained by twisting several hundreds of glass filaments, one of reinforcing materials, to manufacture yarns and then weaving the yarns. The glass filament may be a processed ore product mainly composed of silica. The glass fiber may have excellent thermal resistance, mechanical strength, and electrical insulation.

The first metal lines 304a and the second metal lines 304b may be provided on the second core 302. The first metal line 304a may be on a first side of the second core 302. The second metal line 304b may be on a second side, opposite side of the first side, of the second core 302. For example, the first side of the second core 302 may be a bottom surface of the second core 302, and the second side of the second core 302 may be a top surface of the second core 302. The first and second metal lines 304a and 304b may include at least one metal of, for example, copper (Cu), aluminum (Al), nickel (Ni), iron (Fe), tungsten (W), silver (Ag), gold (Au), or an alloy thereof.

The third solder resist layer 306a may be on, e.g., directly on, the first side of the second core 302, and the fourth solder resist layer 306b may be on, e.g., directly on, the second side of the second core 302. Thus, the fourth solder resist layer 306b the second core 302, and the third solder resist layer 306a may be stacked along the Z direction in that order.

The third solder resist layer 306a may expose the first metal lines 304a, and the fourth solder resist layer 306b may expose the second metal lines 304b.

The first package substrate 301 may have a coefficient of thermal expansion (CTE, or thermal expansion coefficient) that changes depending on a material of the second core 302, a material of each of the first and second metal lines 304a and 304b, the number of the first and second metal lines 304a and 304b, and/or a constitutional ratio of materials included in the first and second metal lines 304a and 304b. The CTE of the first package substrate 301 may fall within a range, for example, from about 0 ppm/t to about 30 ppm/to. More narrowly, the CTE of the first package substrate 301 may fall within a range from about 5 ppm/M to about 15 ppm/to. The CTE of the first package substrate 301 may be different from that of the circuit board 100. The CTE of the first package substrate 301 may be different from that of the connection structure 200. In some embodiments, a difference in CTE between the circuit board 100 and the connection structure 200 may be less than a difference in CTE between the circuit board 100 and the first package substrate 301.

Solder balls 308 may be provided on a first side of the first package substrate 301. The first side of the first package substrate 301 may be a bottom surface of the first package substrate 301. The solder balls 308 may be on and in contact, e.g., direct contact, with the first metal lines 304a. The solder balls 308 may be correspondingly on the inner leads 204. The solder balls 308 may be disposed between the first metal lines 304a and the inner leads 204. The solder balls 308 may be adhered onto the inner leads 204, such that the first package substrate 301 may be fixed to the connection structure 200. The first package substrate 301 may be electrically connected through the solder balls 308 to the connection structure 200, e.g., the first package substrate 301 may only be in direct contact with the connection structure 200 through the solder balls 308, e.g., the first semiconductor package 300 may be supported only by the connection structure 200 without touching the circuit board 100. The solder balls 308 may include at least one of, e.g., copper (Cu), aluminum (Al), silver (Ag), tin (Sn), and gold (Au). Each of the solder balls 308 may be formed as a multiple layer or a single layer.

The first package substrate 301 may be electrically connected through the connection structure 200 to the circuit board 100. For example, the first package substrate may have a contact area between each of the solder balls 308 and each of the inner leads 204 that is large enough to improve adhesion reliability therebetween. In some embodiments, regardless of the positions of the solder balls 308, the outer leads 206 electrically connected to the solder balls 308 may be freely disposed on the circuit board 100 without restriction. For example, the circuit board 100 may have a portion that does not overlap the first semiconductor package 300 along the Z direction, and the outer leads 206 may be on the non-overlapping region of the circuit board 100 to come into contact with the first circuit line 103a. Accordingly, the degree of freedom may be increased in routing wiring lines (or the outer leads 206) that electrically connect the solder balls 308 to the circuit board 100.

According to some embodiments, as the connection structure 200, which connects between the circuit board 100 and the first semiconductor package 300, includes a material whose CTE is the same as or similar to that of the circuit board 100, a difference in expansion and contraction between the connection structure 200 and the circuit board 100 may be reduced. Thus, cracks generated at a contact surface between the connection structure 200 and the circuit board 100, maybe eliminated or reduced, thereby increasing joint reliability. Further, heat generated in the first semiconductor package 300 may be dissipated outside through the connection structure 200.

The first semiconductor chip 310 may be on a side of the first package substrate 301 opposite the inner leads 204. The opposite side of the first package substrate 301 may be a top surface of the first package substrate 301. The first semiconductor chip 310 may be fixed through an adhesive layer onto the opposite surface of the first package substrate 301. For example, the first semiconductor chip 310 may be or include a semiconductor logic chip or a semiconductor memory chip. The through vias 313 may be in the first semiconductor chip 310. For example, the through vias 313 may penetrate the first semiconductor chip 310 along the Z direction. The through vias 313 may electrically connect the first package substrate 301 and the first semiconductor chip 310. The through vias 313 may include a conductive material (e.g., silicon) or a metallic material.

The second semiconductor chip 320 may be on the first semiconductor chip 310. The second semiconductor chip 320 may be fixed through an adhesive layer onto the first semiconductor chip 310. For example, the second semiconductor chip 320 may be or include a semiconductor logic chip or a semiconductor memory chip. The second semiconductor chip 320 and the first package substrate 301 may be electrically connected to each other through the first bonding wires 323 disposed therebetween. The first bonding wires 323 may include a metallic material (e.g., gold).

The first molding layer 330 may be provided on the opposite side of the first package substrate 301. The first molding layer 330 may cover the opposite side of the first package substrate 301, the first and second semiconductor chips 310 and 320, and the first bonding wires 323. The first molding layer 330 may be physically spaced apart from the connection structure 200. The first molding layer 330 may include an epoxy molding compound (EMC).

Figure 3:
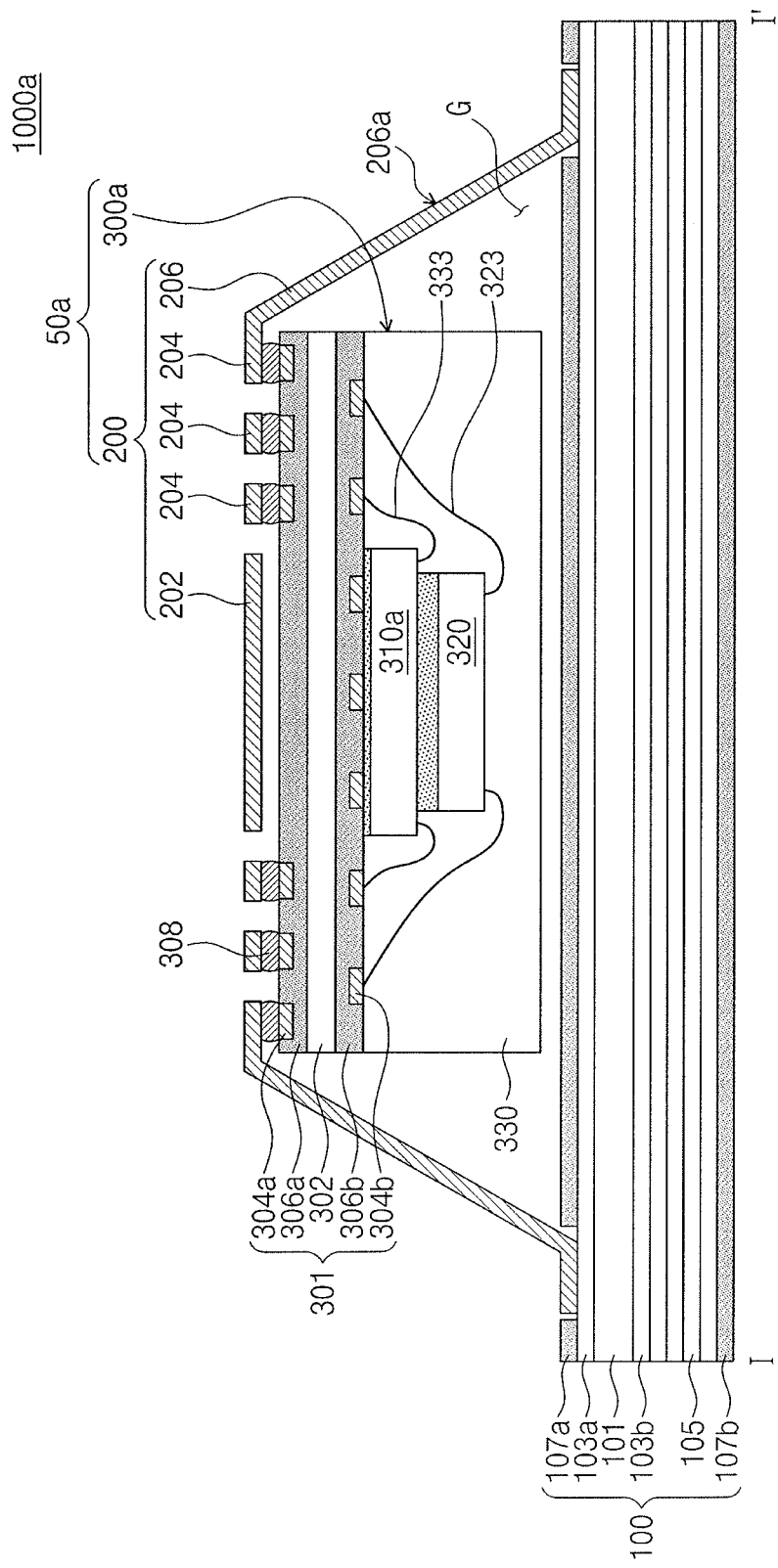
FIG. 3 illustrates a cross-sectional view taken along line I-I' of FIG. 1, of a semiconductor module according to exemplary embodiments.

FIG. 3 illustrates a cross-sectional view taken along line I-I' of FIG. 1, showing a semiconductor module according to exemplary embodiments. For brevity of description, components substantially the same as those discussed with reference to FIGS. 1 and 2 are allocated the same reference numerals thereto, and an explanation thereof will not be repeated.

Referring to FIG. 3, a semiconductor module 1000a includes a semiconductor package structure 50a with a first semiconductor chip 310a electrically connected to the first package substrate 301 through second bonding wires 333 disposed therebetween. For example, the first semiconductor chip 310a may include no through vias 313 illustrated in FIG. 2. The second bonding wires 333 may include a metallic material (e.g., gold).

Figure 4:
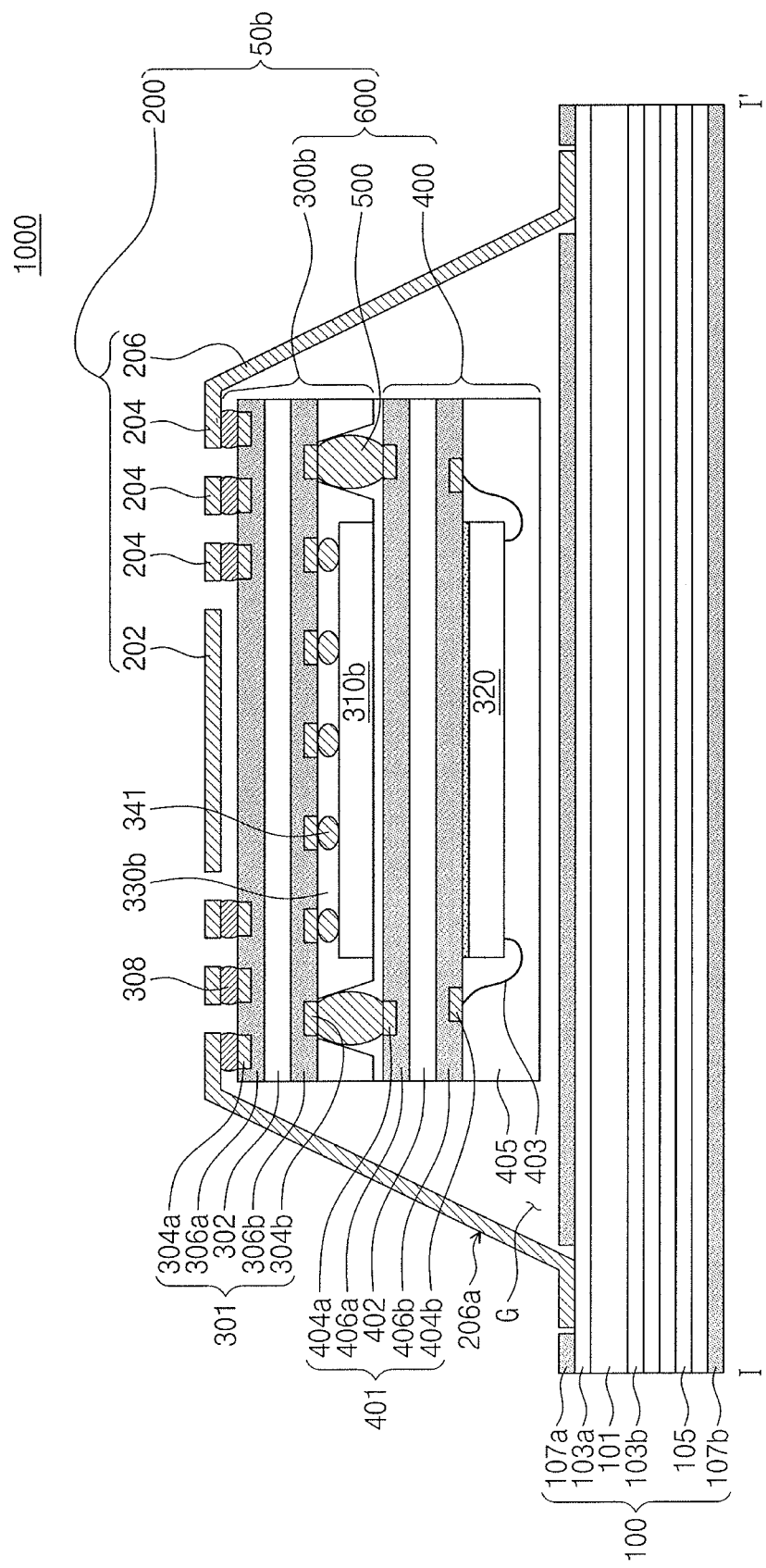
FIG. 4 illustrates a cross-sectional view taken along line I-I' of FIG. 1, of a semiconductor module according to exemplary embodiments.

FIG. 4 illustrates a cross-sectional view taken along line I-I' of FIG. 1, showing a semiconductor module according to exemplary embodiments. For brevity of description, components substantially the same as those discussed with reference to FIGS. 1 and 2 are allocated the same reference numerals thereto, and an explanation thereof will not be repeated.

Referring to FIG. 4, a semiconductor module 1000b may include a semiconductor package structure 50 and a circuit board 100. The semiconductor package structure 50b may include the connection structure 200 and a semiconductor package 600. The semiconductor package 600 may include a first semiconductor package 300b, a second semiconductor package 400, and connection terminals 500. The first semiconductor package 300 may be between the circuit board 100 and the connection structure 200. The first semiconductor package 300 may include the first package substrate 301, solder balls 308, a first semiconductor chip 310b, chip terminals 341, and a first molding layer 330b. The first package substrate 301 may include the second core 302, first and second metal lines 304a and 304b, and third and fourth solder resist layers 306a and 306b.

The solder balls 308 may be between the connection structure 200 and the first package substrate 301. The first semiconductor chip 310b may be on a side of the first package substrate 301 opposite the inner leads 204. The first semiconductor chip 310b may be adhered through the chip terminals 341 onto the first package substrate 301. For example, the chip terminals 341 may be disposed between the first package substrate 301 and the first semiconductor chip 310. The chip terminals 341 may electrically connect the first package substrate 301 and the first semiconductor chip 310b. The first molding layer 330 may be provided on the opposite side of the first package substrate 301. The first molding layer 330b may be disposed on lateral surfaces of the first semiconductor chip 310, and may fill a space between the first package substrate 301 and the first semiconductor chip 310b. The first molding layer 330 may be physically spaced apart from the connection structure 200. The first molding layer 330 may include an epoxy molding compound (EMC).

The second semiconductor package 400 may be between the circuit board 100 and the first semiconductor package 300. The second semiconductor package 400 may include a second package substrate 401, a second semiconductor chip 320, bonding wires 403, and a second molding layer 405. The second package substrate 401 may be configured the same as the first package substrate 301. For example, the second package substrate 401 may include a core 402, metal lines 404a, 404b, and solder resist layers 406a, 406b that are otherwise similar to those of the first package substrate 301.

The second semiconductor chip 320 may be on a first side of the second package substrate 401. The first side of the second package substrate 401 may be a top surface of the second package substrate 401. The second semiconductor chip 320 may be adhered through an adhesive layer onto the first side of the second package substrate 401. The second semiconductor chip 320 and the second package substrate 401 may be electrically connected to each other through the bonding wires 403 disposed therebetween. The bonding wires 403 may include a metallic material (e.g., gold). The second molding layer 405 may be provided on the one side of the second package substrate 401. The second molding layer 405 may cover the second semiconductor chip 320 and the bonding wires 403. The second molding layer 405 may be physically spaced apart from the connection structure 200. The second molding layer 405 may include an epoxy molding compound (EMC).

The connection terminals 500 may be provided between the first semiconductor package 300 and the second semiconductor package 400. The connection terminals 500 may be in the first molding layer 330b and in contact with the first package substrate 301 and the second package substrate 401, e.g., in direct contact with metal lines 304b of the first package substrate and in direct contact with metal lines 404a. The connection terminals 500 may electrically connect the first semiconductor package 300 and the second semiconductor package 400.

Figure 5:
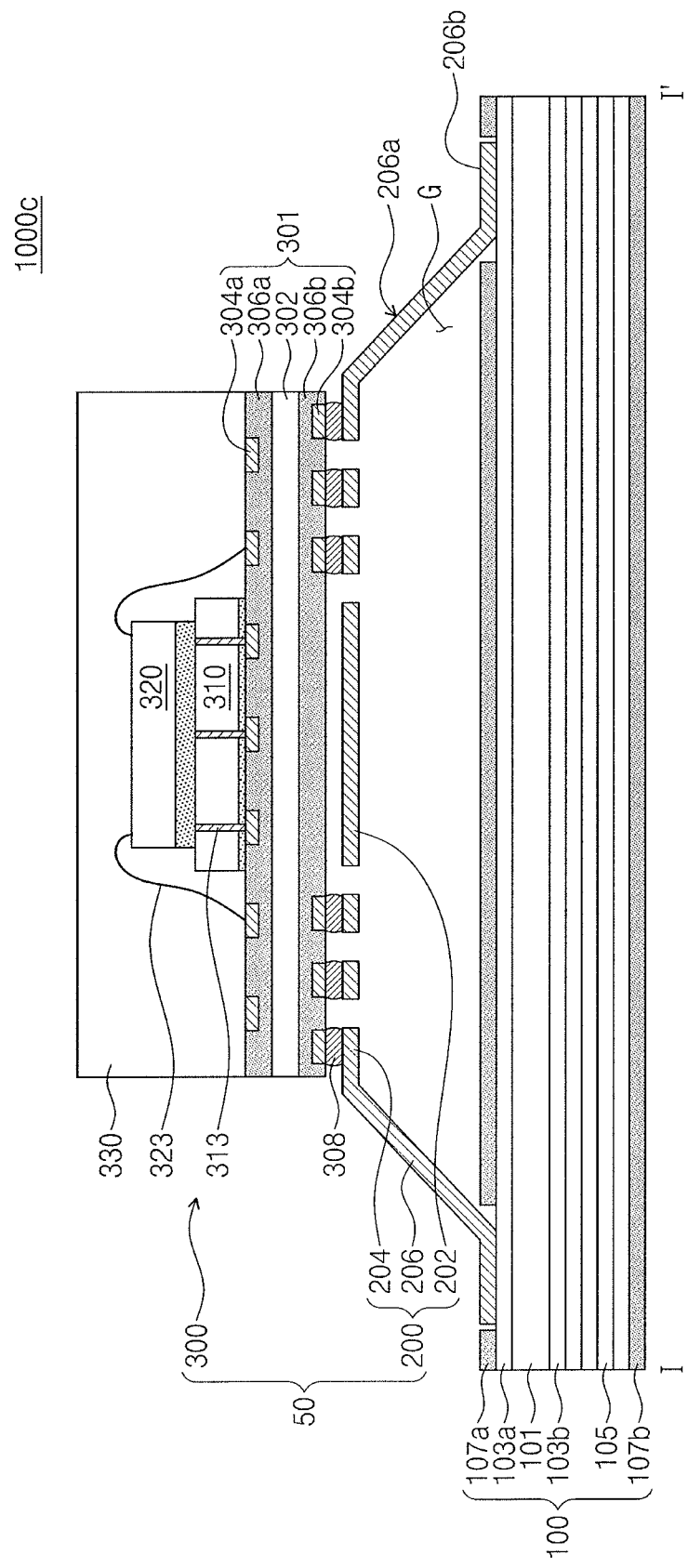
FIG. 5 illustrates a cross-sectional view taken along line I-I' of FIG. 1, of a semiconductor module according to exemplary embodiments.

FIG. 5 illustrates a cross-sectional view taken along line I-I' of FIG. 1, showing a semiconductor module according to exemplary embodiments. For brevity of description, components substantially the same as those discussed with reference to FIGS. 1 and 2 are allocated the same reference numerals thereto, and an explanation thereof will not be repeated.

Referring to FIG. 5, a semiconductor module 1000c may include the semiconductor package structure 50 and the circuit board 100. The semiconductor package structure 50 may be disposed on the circuit board 100. The semiconductor package structure 50 may include the connection structure 200 and the first semiconductor package 300. The first semiconductor package 300 may be disposed on the circuit board 100, and the connection structure 200 may be disposed between the circuit board 100 and the first semiconductor package 300. The first semiconductor package 300 may be located at a level higher than that of inner leads 204 of the connection structure 200. For example, the first semiconductor package 300 may not be placed in a recession G of the connection structure 200, e.g., the connection structure 200 and the first semiconductor package 300 may be stacked along the Z direction in that order on the circuit board 100. Solder balls 308 may be disposed between the first package substrate 301 and the connection structure 200, being in contact with the inner leads 204.

Figure 6A:
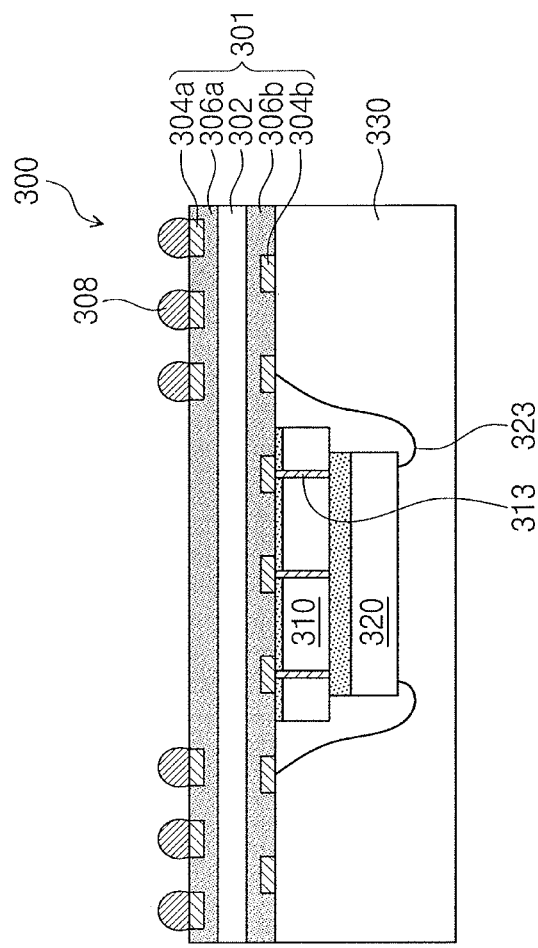
FIGS. 6A to 6C illustrate cross-sectional views of stages in a method of fabricating a semiconductor module according to exemplary embodiments.
Figure 6B:
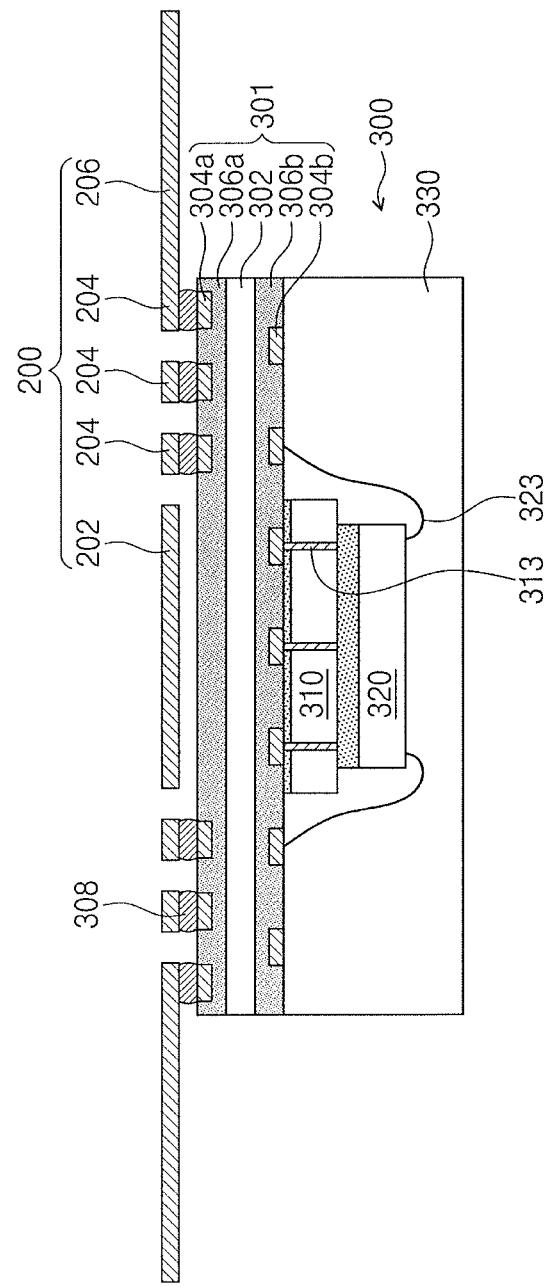
Figure 6C:
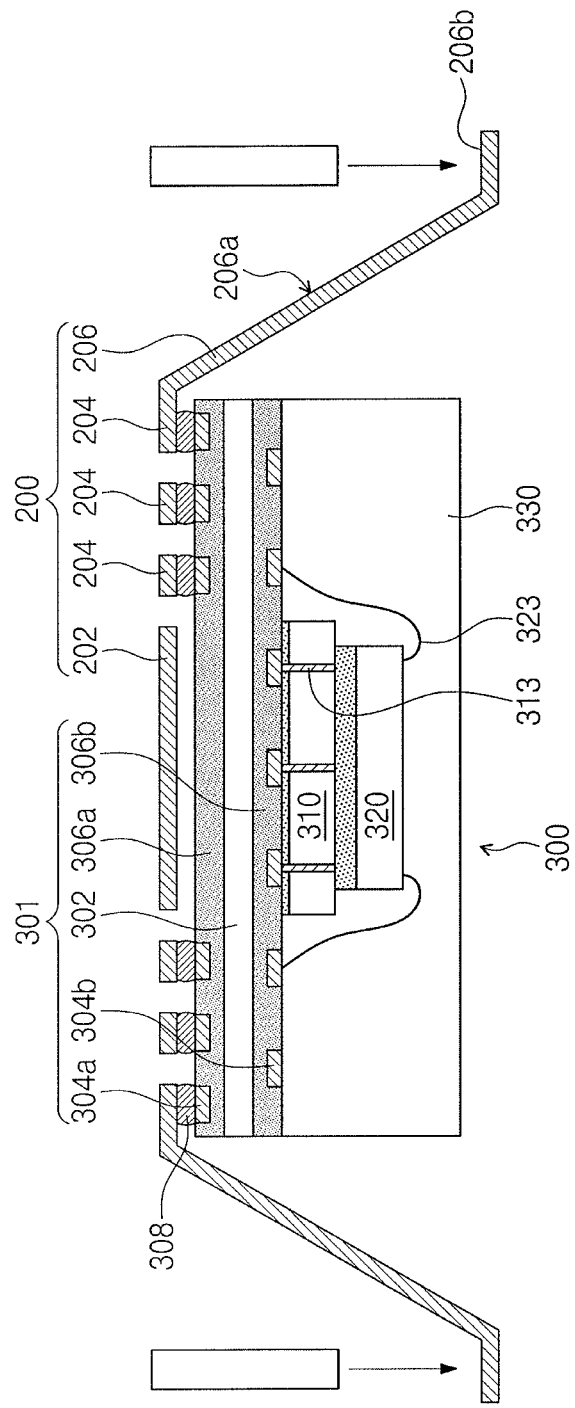

FIGS. 6A to 6C illustrate cross-sectional views showing stages in a method of fabricating a semiconductor module according to exemplary embodiments.

Referring to FIG. 6A, a first semiconductor package 300 may be provided. The first semiconductor package 300 may include the first package substrate 301, solder balls 308, the first semiconductor chip 310, through vias 313, the second semiconductor chip 320, first bonding wires 323, and the first molding layer 330.

The first package substrate 301 may include the second core 302, first and second metal lines 304a and 304b, and third and fourth solder resist layers 306a and 306b. The first package substrate 301 is discussed above with reference to FIGS. 1 and 2, and thus a description thereof will not be repeated.

The first semiconductor chip 310 and the second semiconductor chip 320 may be sequentially mounted on a first side of the first package substrate 301. The first semiconductor chip 310 may be fixed through an adhesive layer onto the first side of the first package substrate 301. The first semiconductor chip 310 may include the through vias 313. The through vias 313 may be formed in the first semiconductor chip 310. The through vias 313 may electrically connect the first package substrate 301 and the first semiconductor chip 310. The second semiconductor chip 320 may be fixed through an adhesive layer onto the first semiconductor chip 310. The first bonding wires 323 may be formed between the second semiconductor chip 320 and the first package substrate 301. The first bonding wires 323 may be formed to extend from the second semiconductor chip 320 to the second metal lines 304b, thereby electrically connecting the second semiconductor chip 320 and the first package substrate 301.

The first molding layer 330 may be formed to cover the first and second semiconductor chips 310 and 320 and the first bonding wires 323. The first molding layer 330 may include, for example, an epoxy molding compound (EMC).

The solder balls 308 may be formed on a second side of the first package substrate 301. The solder balls 308 may be in contact with and electrically connected to the first metal lines 304a. The solder balls 308 may include at least one of, e.g., copper (Cu), aluminum (Al), silver (Ag), tin (Sn), nickel (Ni), and gold (Au). Each of the solder balls 308 may be formed as a multiple layer or a single layer. A soldering process may be performed to form the solder balls 308 on the first metal lines 304a. The soldering process may be carried out in such a way that metal layers may be formed on the first metal lines 304a and then reflowed. When the metal layers are reflowed, the metal layers may be changed into a liquid state and formed into the solder balls 308 shaped like beads.

Referring to FIG. 6B, the connection structure 200 may be placed on the first semiconductor package 300. The connection structure 200 may include the central pad 202, inner leads 204, and outer leads 206. The inner leads 204 may surround the central pad 202. The outer leads 206 may be physically and electrically connected to corresponding inner leads 204. The inner leads 204 may be disposed between the outer leads 206. The placing of the connection structure 200 on the first semiconductor package 300 may include disposing the connection structure 200 on the first semiconductor package 300 to cause the inner leads 204 to come into contact with the solder balls 308, joining the solder balls 308 and the inner leads 204 to each other by melting the solder balls 308 and/or by applying a physical force between the solder balls 308 and the inner leads 204, and performing a trimming process to physically separate the outer leads 206 from bars (see 202a of FIG. 1) connected to corners of the central pad 202. The connection structure 200 may include at least one of, for example, copper (Cu), nickel (Ni), iron (Fe), aluminum (Al), tungsten (W), silver (Ag), gold (Au), or an alloy thereof.

Referring to FIG. 6C, the connection structure 200 may undergo a forming process to bend the outer leads 206. The forming process may be a manufacturing process in which a mechanical force is externally applied to bend the outer leads 206. Accordingly, the outer leads 206 may be bent, and the connection structure 200 may have a protruding shape at its portion on which the inner leads 204 and the central pad 202 are disposed. The outer leads 206 may have inclined surfaces 206a and flat surfaces 206b.

In other embodiments, differently from that shown in figures, the first semiconductor package 300 may be adhered onto the connection structure 200 including the outer leads 206 that are originally bent.

Referring back to FIG. 2, the circuit board 100 may be mounted with the connection structure 200 to which the first semiconductor package 300 is adhered. The circuit board 100 may include a first core 101, a first circuit line 103a, second circuit lines 103b, insulation layers 105, and first and second solder resist layers 107a and 107b. The circuit board 100 is discussed above with reference to FIGS. 1 and 2, and thus a repetitive description thereof will be omitted. The outer leads 206 may be adhered onto the first circuit line 103a. The outer leads 206 and the first circuit line 103a may be in contact with each other. The outer leads 206 and the first circuit line 103a may be in contact with and adhered to each other through a solder material coated on the first circuit line 103a.

According to some embodiments, a circuit board and a semiconductor package may be electrically connected to each other through a connection structure, e.g., only through a connection structure such that there is no direct contact between the circuit board and a semiconductor package. The connection structure may include a material whose coefficient of thermal expansion is the same as or similar to that of the circuit board. Thus, a difference in expansion and contraction between the connection structure and the circuit board may be reduced. Therefore, the connection structure and the circuit board may have improved joint reliability therebetween.

Furthermore, heat generated in the semiconductor package may be dissipated through the connection structure into the circuit board. Thus, the semiconductor package may have effective heat dissipation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor module, comprising:
   a circuit board;
   a first semiconductor package over the circuit board; and
   a connection structure on the circuit board and connecting the circuit board and the first semiconductor package, the connection structure including a plurality of outer leads and a plurality of inner leads between the outer leads, and the inner leads being connected to corresponding outer leads,
   wherein the outer leads are in contact with the circuit board,
   wherein the first semiconductor package includes a first package substrate, and
   wherein a difference between thermal expansion coefficients of the connection structure and the circuit board is less than a difference between thermal expansion coefficients of the circuit board and the first package substrate.

2. The semiconductor module as claimed in claim 1, wherein the first semiconductor package is spaced apart from the circuit board.

3. The semiconductor module as claimed in claim 1, wherein:
   the circuit board includes a circuit line, and
   the connection structure includes the same material as that of the circuit line, wherein the same material includes at least one of copper (Cu), aluminum (Al), nickel (Ni), iron (Fe), tungsten (W), silver (Ag), gold (Au), or an alloy thereof.

4. The semiconductor module as claimed in claim 1, wherein
   the inner leads are arranged in first and second directions intersecting each other,
   the outer leads extend in the first direction, and
   the outer leads are spaced apart from each other in the second direction.

5. The semiconductor module as claimed in claim 1, wherein the first semiconductor package is between the circuit board and the connection structure.

6. The semiconductor module as claimed in claim 5, wherein the first semiconductor package includes:
- a plurality of solder balls on one side of the first package substrate; and
- a first semiconductor chip on an opposite side of the first package substrate,
- wherein the solder balls are in contact with the inner leads.

7. The semiconductor module as claimed in claim 6, wherein the first semiconductor package further includes:
- a second semiconductor chip between the first semiconductor chip and the circuit board;
- a plurality of bonding wires connecting the second semiconductor chip and the first package substrate; and
- a first molding layer covering the first and second semiconductor chips.

8. The semiconductor module as claimed in claim 5, wherein the connection structure is longer in a stacking direction than the first semiconductor package.

9. The semiconductor module as claimed in claim 5, wherein the connection structure has a recession surrounded by the outer leads, and the first semiconductor package is disposed in the recession.

10. The semiconductor module as claimed in claim 1, wherein
- the connection structure is between the circuit board and the first semiconductor package,
- the first semiconductor package further includes a plurality of solder balls on one side of the first package substrate,
- the outer leads are in contact with the circuit board, and the inner leads are in contact with the solder balls.

11. The semiconductor module as claimed in claim 1, wherein the connection structure includes a single layer.

\* \* \* \* \*